(12) United States Patent
Coimbra et al.

(10) Patent No.: US 12,282,047 B2
(45) Date of Patent: Apr. 22, 2025

(54) LOW POWER AND HIGH ACCURACY VOLTAGE MONITOR WITH BUILT-IN REFERENCE

(71) Applicant: Analog Devices International Unlimited Company, Limerick (IE)

(72) Inventors: Ricardo Pureza Coimbra, Paterna (ES); Mateus Ribeiro Vanzella, Valencia (ES)

(73) Assignee: Analog Devices International Unlimited Company, Limerick (IE)

( * ) Notice: Subject to any disclaimer, the term of this patent is extended or adjusted under 35 U.S.C. 154(b) by 175 days.

(21) Appl. No.: 18/177,868

(22) Filed: Mar. 3, 2023

(65) Prior Publication Data
US 2024/0295589 A1 Sep. 5, 2024

(51) Int. Cl.
*G01R 19/165* (2006.01)
(52) U.S. Cl.
CPC .............. *G01R 19/16519* (2013.01)
(58) Field of Classification Search
CPC ........ G01R 19/16504; G01R 19/16519; G01R 19/16538; G01R 19/16542; G01R 19/16547; G01R 19/16552; G05F 3/265; G05F 3/267; G05F 3/30
See application file for complete search history.

(56) References Cited

U.S. PATENT DOCUMENTS

| | | | |
|---|---|---|---|
| 6,894,544 B2 | 5/2005 | Gubbins | |
| 7,440,249 B2 | 10/2008 | Sheng et al. | |
| 10,429,879 B1 | 10/2019 | Coimbra | |
| 11,199,565 B1 | 12/2021 | Wang et al. | |
| 11,353,910 B1 | 6/2022 | Wadhwa et al. | |
| 2020/0173862 A1 | 6/2020 | Coimbra et al. | |
| 2024/0295590 A1 | 9/2024 | Coimbra et al. | |

FOREIGN PATENT DOCUMENTS

CN 118584172 A 9/2024

OTHER PUBLICATIONS

"Chinese Application Serial No. 202310518097.4, Voluntary Amendment filed Oct. 15, 2024".
"European Application Serial No. 24152474.3, Extended European Search Report mailed Jun. 24, 2024", 9 pgs.
Riccardo, Pittassi, et al., "Voltage Supply Threshold Detector", Oct. 1, 2004, vol., (Oct. 1, 2004), 62 pages.
Ryadh, M, et al., "An improved method of highly accurate supply detection using bandgap reference circuit and its implementation in a pseudo BiCMOS proces", ICECE. Int Conf, IEEE Piscataway, NJ, USA, (Dec. 20, 2008), 311-314.

(Continued)

*Primary Examiner* — Steven L Yeninas
(74) *Attorney, Agent, or Firm* — Schwegman Lundberg & Woessner, P.A.

(57) ABSTRACT

A voltage monitor circuit that signals if an input voltage is above or below an internally established reference level proportional to the bandgap voltage of silicon. The voltage monitor circuit mitigates main error sources generally associated with bandgap reference generation such that high accuracy and good performance may be achieved at low power cost. The techniques allow voltage monitors (e.g., brown-out and power on reset (POR) detectors) to be implemented with higher accuracy, lower power consumption, smaller area cost, and support to lower supply voltage than other solutions.

20 Claims, 8 Drawing Sheets

(56) References Cited

OTHER PUBLICATIONS

Weiling, Guo, et al., "Design of a Low Temperature Drift Undervoltage Lockout Circuit-Used for GaN FET Power Driver IC", 15th China Intl Forum On Solid State Lighting Sslchina: IFWS), IEEE, (Oct. 23, 2018), 1-4.

Wu, Haonan, et al., "Design of a Low Temperature Drift UVLO Circuit with Base Current Compensation", IEEE Int Conf Edssc, IEEE, (Jun. 12, 2019), 1-3.

"European Application Serial No. 24152474.3, Response filed Jan. 14, 2025 to Extended European Search Report mailed Jun. 24, 2024", 36 pgs.

LOW POWER AND HIGH ACCURACY VOLTAGE MONITOR WITH BUILT-IN REFERENCE

RELATED APPLICATIONS

This application is related to copending US application "LOW POWER AND HIGH ACCURACY VOLTAGE MONITOR WITH BUILT-IN REFERENCE" to Coimbra et al., filed on the same date herewith and assigned to the same assignee.

FIELD OF THE DISCLOSURE

This document pertains generally to electronic circuits and, more particularly, to voltage monitoring circuits.

BACKGROUND

It is often necessary in the design of electronic circuitry to ensure that specific portions of a circuit begin operation in a known state. It is also often true that specific types of circuitries do not operate properly unless the power supply voltage is above a certain voltage. A circuit that monitors an analog supply voltage and determines whether the voltage is sufficient for reliable operation of associated circuitry, is often termed a "brown-out detector."

Determining whether the supply voltage has reached a sufficient level can be particularly important when battery-powered equipment is involved. In a battery-powered environment, it is also desirable that any monitoring circuitry employed utilize as little power as possible. In addition, a monitoring circuit should function reliably at a predetermined threshold voltage regardless of operating temperature.

SUMMARY OF THE DISCLOSURE

This disclosure describes a voltage monitor circuit that signals if an input voltage is above or below an internally established reference level proportional to the bandgap voltage of silicon. The voltage monitor circuit mitigates main error sources generally associated with bandgap reference generation such that high accuracy and good performance may be achieved at low power cost. The techniques of this disclosure allow voltage monitors (e.g., brown-out and power on reset (POR) detectors) to be implemented with higher accuracy, lower power consumption, smaller area cost, and support to lower supply voltage than other solutions.

In some aspects, this disclosure is directed to a voltage monitoring circuit having a built-in reference and configured to monitor a voltage, the voltage monitoring circuit comprising: a closed loop circuit branch including: a first bipolar junction transistor (BJT) having: a first collector configured to produce a first collector current, wherein the first collector current is a function of the monitored voltage; and a first emitter coupled to a reference node; a biasing network coupled to a first base of the first BJT and configured to generate a first voltage dependent at least on the monitored voltage to bias a second BJT, the biasing network including a first current source configured to sink a first current that is proportional to the first collector current; and a second current source coupled to a power supply node and configured to source a second current that is proportional to the first collector current to a current comparison node; the second BJT having: a second base coupled to the first voltage; a second emitter coupled to the reference node; a second collector coupled to the current comparison node and configured to receive a second collector current, wherein the current comparison node is configured to generate a signal representing a comparison between a representation of the second current and a representation of the second collector current.

In some aspects, this disclosure is directed to a voltage monitoring circuit having a built-in reference and configured to monitor a voltage, the voltage monitoring circuit comprising: a closed loop circuit branch including: a first bipolar junction transistor (BJT) having: a first collector configured to produce a first collector current, wherein the first collector current is a function of the monitored voltage; and a first emitter coupled to a reference node; a biasing network coupled to a first base of the first BJT and configured to generate a first voltage dependent at least on the monitored voltage to bias a second BJT, the biasing network including a third BJT configured to sink a first current that is proportional to the first collector current; and a second current source coupled to a power supply node and configured to source a second current that is proportional the first collector current to a current comparison node; the second BJT having: a second base coupled to the first voltage; a second emitter coupled to the reference node; a second collector coupled to the current comparison node and configured to receive a second collector current, wherein the current comparison node is configured to generate a signal representing a comparison between a representation of the second current and a representation of the second collector current.

In some aspects, this disclosure is directed to a voltage monitoring circuit having a built-in reference and configured to monitor a voltage at monitored node, the voltage monitoring circuit comprising: means for generating a first current based on the monitored voltage at the monitored node; means for biasing base voltage nodes of a first bipolar junction transistor (BJT) and a second BJT with corresponding first and second base voltages that are based on the first current; means for generating, by the first BJT, a first collector current that is based on the first current; means for generating, by the second BJT, a second collector current that is also based on the monitored current, wherein the first and second BJTs are arranged in a common-emitter configuration having different collector current density values; and means for providing an output signal, wherein the output signal includes binary states indicating whether the monitored voltage exceeds a specified threshold value.

In some aspects, this disclosure is directed to a voltage monitoring method for using a built-in reference for monitoring a voltage at a monitored node, the voltage monitoring method comprising: generating a first current based on the monitored voltage at the monitored node; biasing base voltage nodes of a first bipolar junction transistor (BJT) and a second BJT with corresponding first and second base voltages that are based on the first current; generating, by the first BJT, a first collector current that is based on the first current; generating, by the second BJT, a second collector current that is also based on the monitored current, wherein the first and second BJTs are arranged in a common-emitter configuration having different collector current density values; and providing an output signal from a comparison of representations of the first and second collector currents.

In some aspects, this disclosure is directed to a voltage monitoring method for using a built-in reference for monitoring a voltage at a monitored node, the voltage monitoring method comprising: generating a first current based on the monitored voltage at the monitored node; biasing base voltage nodes of a first bipolar junction transistor (BJT) and a second BJT with corresponding first and second base voltages that are based on the first current, wherein biasing the base voltage node of the second BJT includes generating a first voltage dependent at least on the monitored voltage; generating, by the first BJT, a first collector current that is based on the first current; generating, by the second BJT, a second collector current that is also based on the monitored current, wherein the first and second BJTs are arranged in a common-emitter configuration having different collector current density values; generating, via a current source, a current that is proportional to the first collector current; and providing an output signal from a comparison of a representation of the current and a representation of the second collector current, wherein the output signal includes binary states indicating whether the monitored voltage exceeds a specified threshold value.

In some aspects, this disclosure is directed to a voltage monitoring method for using a built-in reference for monitoring a voltage at a monitored node, the voltage monitoring method comprising: generating a first current based on the monitored voltage at the monitored node; biasing base voltage nodes of a first bipolar junction transistor (BJT) and a second BJT with corresponding first and second base voltages that are based on the first current, wherein biasing the base voltage node of the second BJT includes generating a first voltage dependent at least on the monitored voltage; generating, by the first BJT, a first collector current that is based on the first current; generating, by the second BJT, a second collector current that is also based on the monitored current, wherein the first and second BJTs are arranged in a common-emitter configuration having different collector current density values; generating, via a third BJT, a first current that is proportional to the first collector current; generating, via a current source, a second current that is proportional the second collector current; and providing an output signal from a comparison of representations of the first and second collector currents, wherein the output signal includes binary states indicating whether the monitored voltage exceeds a specified threshold value.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
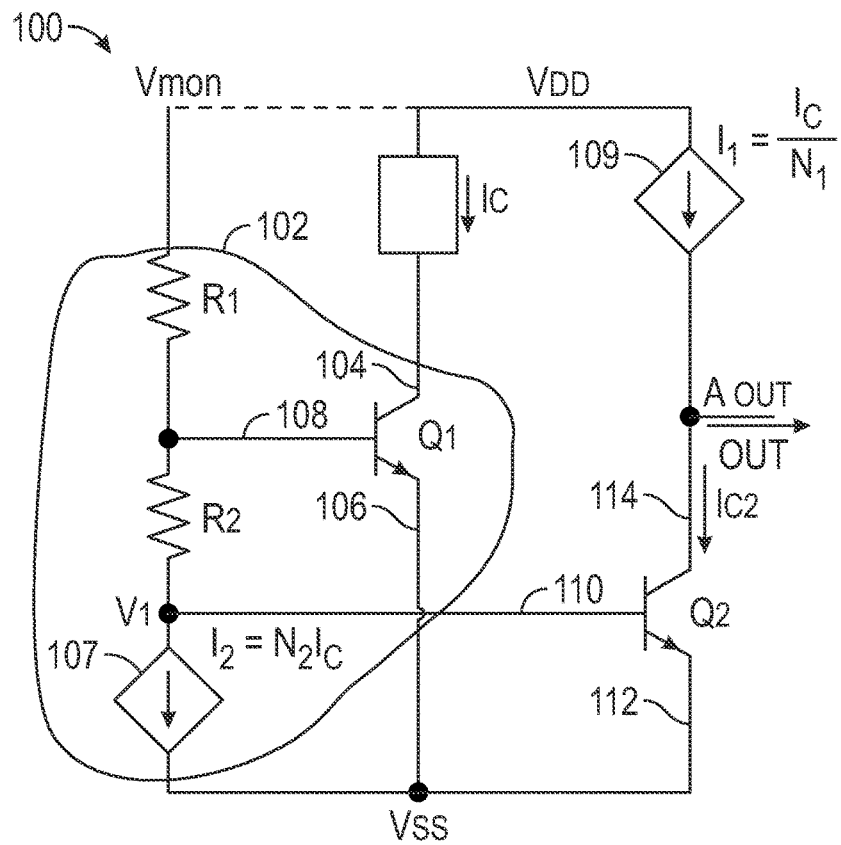
FIG. 1 is an example of a voltage monitoring circuit 100 having a built-in reference and configured to monitor a voltage, in accordance with this disclosure.

In designing voltage monitor circuits, circuit designers are concerned with various aspects such as accuracy, speed, power consumption, area, and support for lower supply voltages. Improving or optimizing one aspect is often at the expense of one or more other aspects. The present inventors have recognized a need for a voltage monitor circuit solution that has higher accuracy, faster speed, lower power consumption, less area, and supports lower supply voltages than existing solutions.

This disclosure describes a voltage monitor circuit that signals if an input voltage is above or below an internally established reference level proportional to the bandgap voltage of silicon. The voltage monitor circuit mitigates main error sources generally associated with bandgap reference generation such that high accuracy and good performance may be achieved at low power cost. The techniques of this disclosure allow voltage monitors (e.g., brown-out and power on reset (POR) detectors) to be implemented with higher accuracy, lower power consumption, smaller area cost, and support to lower supply voltage than other solutions.

The techniques of this disclosure are particularly suited for low-voltage and low-power applications. The monitored voltage level can be set (or programmed) at a wide range, including below and above the bandgap voltage of silicon. The monitored voltage can serve as the supply voltage, in which case the techniques can be made reliable also during supply ramp-up (for no "false alarms").

Accuracy relies on NPN bipolar junction transistor (BJT) thermal properties and device matching only (not sensitive to field-effect transistor thermal properties). A compact, self-biased, and power-efficient architecture is employed in which most of the current flows through an input resistive branch, e.g., resistor branch, where it serves to reduce sensitivity to NPN current gain besides favoring the use of smaller resistive elements, e.g., resistors.

To achieve high accuracy, the techniques of this disclosure can completely eliminate sensitivity to global spread of NPN current gain. The structure includes a closed loop around a first NPN BJT whose collector current becomes set as a function of the monitored voltage (self-biased). The closed loop includes a resistive element network, e.g., resistor network, that generates a voltage dependent on the monitored voltage and on the first NPN's base-emitter voltage to bias a second NPN transistor placed outside of the closed loop.

A digital output is generated by comparing the second NPN's collector current to a proportional copy of the first NPN's collector current provided by a current mirror. If the monitored voltage is below the threshold level, the second NPN may be used directly to "pull down" the output node, or one or more stages can be added in between, to generate a proportional copy of the current of the second NPN so that both "pull-up" and "pull-down" are accomplished via current mirrors. The threshold condition corresponds to the second NPN's collector current becoming equal to the current provided by the current mirror, e.g., being proportional to the first NPN's collector current. This occurs when the monitored voltage becomes proportional to the bandgap voltage of silicon by a factor defined by design. Optional components can be used to set such factor at values below or above 1. Other optional elements may be used to compensate for NPN base currents thereby reducing (or practically eliminating) sensitivity to NPN current gain.

FIG. 1 is an example of a voltage monitoring circuit 100 having a built-in reference and configured to monitor a voltage, in accordance with this disclosure. The voltage monitoring circuit 100 includes a closed loop circuit branch 102 that includes a first bipolar junction transistor (BJT) Q1 and a biasing network. The first BJT Q1 includes a first collector 104 configured to produce a first collector current $I_C$. The monitored voltage VMON applied to the resistor network produces a Q1 base-emitter voltage that causes the first BJT Q1 to conduct collector current IC1 that gets copied (proportionally) by a first current source 107 being sunk from below the resistor network thereby closing a loop. The first collector current $I_C$ is a function of the monitored voltage VMON. In the example shown, the monitored voltage VMON is the supply voltage VDD (as indicated by the dashed line). In other examples, the monitored voltage VMON is a voltage other than the supply voltage VDD. The first BJT Q1 includes a first emitter 106 coupled to a reference node, e.g., voltage reference VSS.

The biasing network includes a first resistive element R1 and a second resistive element R2 coupled in series and includes a first current source 107 configured to sink a first current I2 that is proportional to the first collector current $I_C$. For example, the first current I2 equals $N_2 I_C$, where $N_2$ is a constant that corresponds to a proportion value. The biasing network is coupled to a first base 108 of the first BJT Q1 and configured to generate a first voltage V1 dependent at least on the monitored voltage VMON to bias a second BJT Q2. In FIGS. 1-3 and 5-15, the first BJT Q1 and the second BJT Q2 are arranged in a common-emitter configuration having different collector current density values.

The voltage monitoring circuit 100 includes a second current source 109 coupled to a power supply node VDD and configured to source, to a current comparison node AOUT, a second current I1 that is proportional to the first collector current. For example, the second current I1 equals $I_C/N_1$ where $N_1$ is a constant that corresponds to a proportion value.

The second BJT Q2 has a base 110 coupled to the first voltage V1, an emitter 112 coupled to the reference node VSS, and a collector 114 coupled to the current comparison node AOUT and configured to produce a second collector current IC2. The current comparison node AOUT is configured to generate a signal OUT representing a comparison between a representation of the second current I1 and a representation of the second collector current IC2. An intrinsic comparison is made between the I1 and IC2 values that would occur in case both elements (I1 source and Q2) had enough voltage headroom to operate in their active regions (e.g., if AOUT were held at a mid-level between VDD and VSS). The signal OUT is a digital signal, such as from 0 to VDD, that can be received a digital circuit. In some examples, the signal OUT can be supplied to an output pin of an IC.

The collector current IC of the first BJT Q1 is copied by the first current source 109 and then compared to the collector current IC2 of the second BJT Q2. The current source 107 is used to close a loop around Q1 to generate Q1 and Q2 base-emitter biasing voltages.

Current source 109 is the one that copies Q1 current to compare to IC2 in order to generate AOUT. An intrinsic comparison is done between current levels that would exist in case sources connected to AOUT had enough voltage headroom to operate in their active regions. In addition, the monitored voltage threshold $V_{TSH}$ equals the bandgap voltage $V_{BG}$ (1.2V) of silicon. A detailed principle of operation is described below with respect to FIG. 3.

The voltage monitoring circuit 100 of FIG. 1 can still have some sensitivity to BJT current gain (B). The techniques shown in FIGS. 2 and 3 can reduce or eliminate the sensitivity to BJT current gain (B). Furthermore, the techniques shown in FIGS. 2 and 3 allow setting the monitored voltage threshold $V_{TSH}$ to below or above the bandgap voltage $V_{BG}$ (1.2V). The circuits shown in FIGS. 2 and 3 are extensions of the voltage monitoring circuit 100 of FIG. 1.

Figure 2:
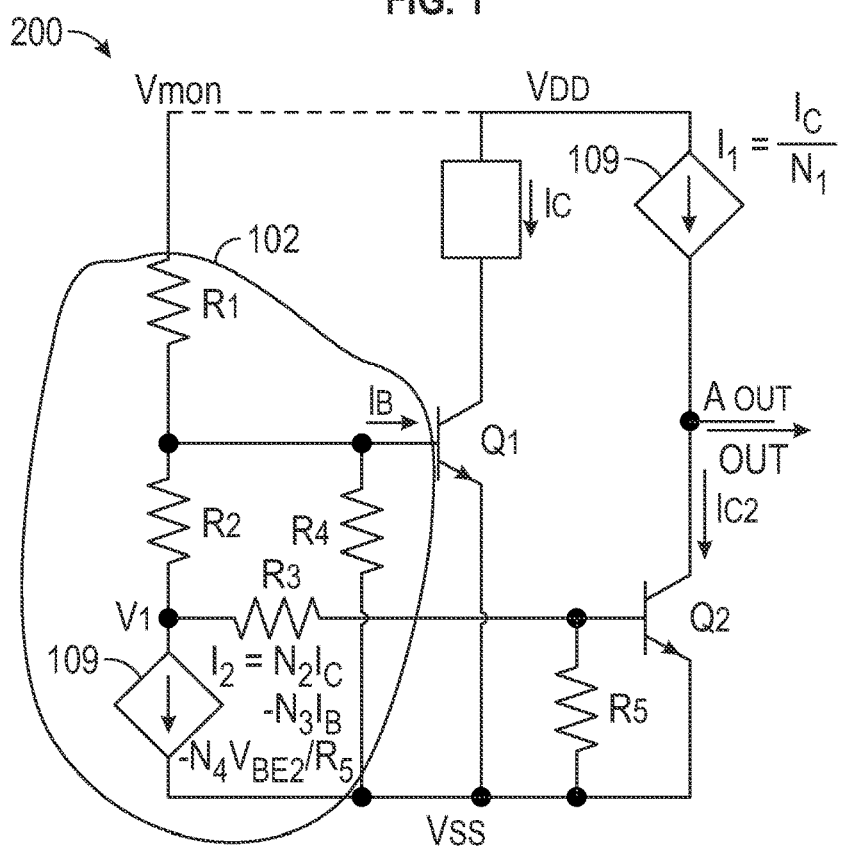
FIG. 2 is another example of a voltage monitoring circuit 200 having a built-in reference and configured to monitor a voltage, in accordance with this disclosure.
Figure 3:
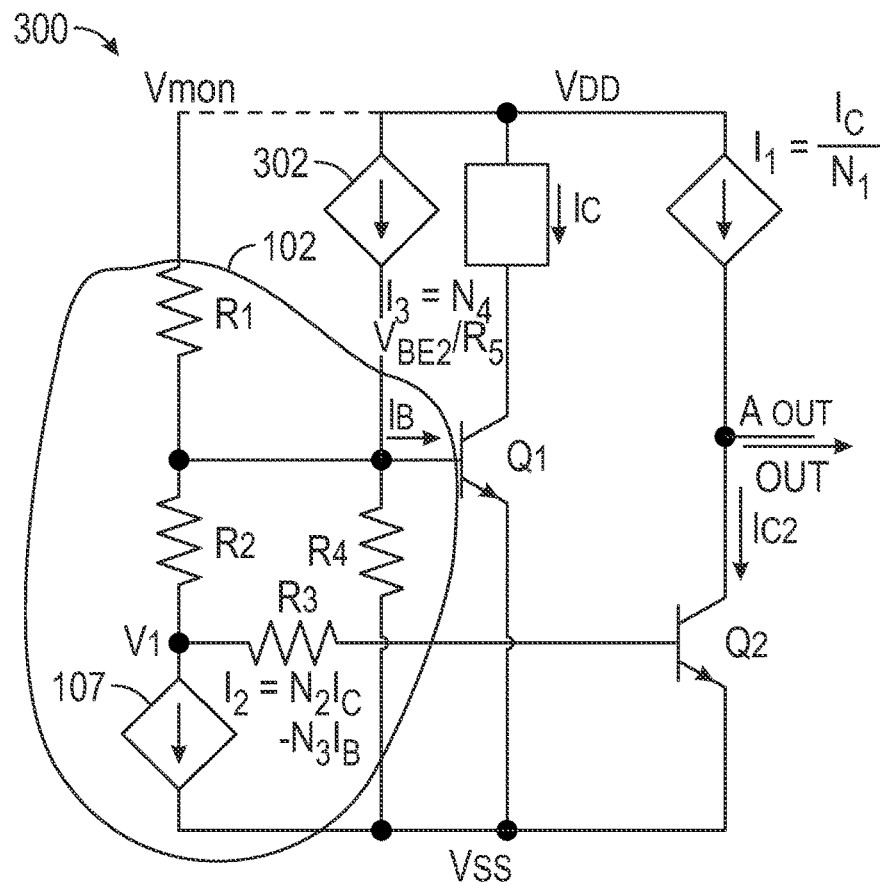
FIG. 3 is another example of a voltage monitoring circuit 300 having a built-in reference and configured to monitor a voltage, in accordance with this disclosure.

FIG. 2 is another example of a voltage monitoring circuit 200 having a built-in reference and configured to monitor a voltage, in accordance with this disclosure. Some of the elements of the voltage monitoring circuit 200 are similar to those of voltage monitoring circuit 100 of FIG. 1. As such, similar reference numbers are used and, for conciseness, similar elements will not be described in detail again.

The voltage monitoring circuit 200 of FIG. 2 includes the components shown in FIG. 1 as well as additional components. The voltage monitoring circuit 200 of FIG. 2 further includes a third resistive element R3 coupled between the base of the second BJT Q2 and a terminal of the second resistive element R2, a fourth resistive element R4 coupled to the base of the first BJT Q1 and the reference node VSS, and a fifth resistive element R5 coupled to the base of the second BJT Q2 and the reference node VSS. By including one or more of the resistive elements R3-R5, the voltage monitoring circuit 200 can set the monitored voltage threshold ($V_{TSH}$) above or below the bandgap voltage. In addition, including one or more of the resistive elements R3-R5 can reduce or eliminate the sensitivity to BJT current gain (B). As an example, resistive element R3 can be added for BJT current gain compensation, and resistive elements R4 and R5 can be added to enable $V_{TSH}$ to be set below or above $V_{BG}$.

Like in FIG. 1, the first current source 107 is configured to sink a first current I2 that is proportional to the first collector current $I_C$. The resistive elements R3-R5 create current components that depend on the VBE components of Q1 and Q2. With inclusion of the additional resistive elements, the first current I2 equals $(N_2I_C-N_3I_B-N_4V_{BE2}/R5)$ where $N_2$, $N_3$, and $N_4$ are constants that corresponds to a proportion value, $I_B$ is the base current of the first BJT Q1, and $V_{BE2}$ is the base-emitter voltage of the second BJT Q2. By including the resistive elements R3-R5, the voltage monitoring circuit 200 can allow 1) canceling of errors from the base currents of BJTs Q1 and Q2; and 2) allow monitoring of voltages from below the bandgap voltage to above the bandgap voltage, thereby providing the flexibility to choose which one to monitor.

FIG. 3 is another example of a voltage monitoring circuit 300 having a built-in reference and configured to monitor a voltage, in accordance with this disclosure. Some of the elements of the voltage monitoring circuit 300 are similar to those of voltage monitoring circuit 100 of FIG. 1 and the voltage monitoring circuit 200 of FIG. 2. As such, similar reference numbers are used and, for conciseness, similar elements will not be described in detail again.

The voltage monitoring circuit 300 further includes a third current source 302 coupled to the power supply node VDD and to the first base of the first BJT and configured to source a third current I3 proportional to the second collector current of the second BJT Q2 or to the first collector current of the first BJT Q1. The third current I3 equals $N_4V_{BE2}/R5$, where $N_4$ are constants that corresponds to a proportion value, and $V_{BE2}$ is the base-emitter voltage of the second BJT Q2. It should be noted that since the current source 302 is implementing the same function of resistor R5 of FIG. 2, the same name R5 is used such that basically the same formula can be used to represent both circuits (FIG. 2 and FIG. 3).

The first current source 107 and the third current source 109 copy currents flowing through BJTs Q1 and Q2, respectively. The third current source 109 copies current through Q2 and the current source 302 generates a new current using VBE2, e.g., it internally applies VBE2 to an internal resistor R5 to produce I=VBE2/R5 and then generates a proportional copy of that I3=$N_4$*VBE/R5 as its output current. The third current source 302 can be used to set the monitored voltage threshold above or below the bandgap voltage. The first current source 107 can be used to sink a current component proportional to $I_B$ of the first BJT Q1 to compensate for the base currents of the first and second BJTs at the threshold condition. When VDD=VTSH (condition where error components need to be cancelled out), Q2 and Q1 base currents become proportional to each other. Hence, both are proportional to $I_B$ and get cancelled out. Note that not only I2 plays a part in cancelling base current effects, but also R3.

Without being bound by theory, the principles of operation are described below. The closed loop around BJT Q1 establishes the collector current $I_C$ of Q1 and the biasing voltage $V_{BE2}$ of BJT Q2 as a function of the monitored voltage VMON. When the monitored voltage VMON equals the threshold voltage $V_{TSH}$, the BJT Q2 operates in its active region with a collector current equal to $I_C/N_1$, where $N_1$ is a proportion value of the collector current of Q1. The threshold voltage $V_{TSH}$ is given by Equation 1:

$$V_{TSH} = V_{BE1}(I_C)\left[1 + R_1\left(\frac{1}{R_4} - \frac{R_3}{R_2R_5}\right)\right] + (V_{BE1} - V_{BE2})\frac{R_1}{R_2}\left(1 + \frac{R_3}{R_5}\right) + R_1\left(1 - \frac{R_3}{N_1R_2}\right)I_B$$

The collector current $I_C$ in Equation 1 is given by Equation 2:

$$I_C = \frac{(V_{BE1} - V_{BE2})}{N_2R_2} + I_B\frac{1}{N_2}\left[N_3 - \frac{1}{N_1}\left(\frac{R3}{R2} + 1\right)\right] + \frac{V_{BE2}}{R_5} + \frac{1}{N_2}\left[N_4 - 1 - \frac{R3}{R2}\right]$$

N1, N2, etc. are constants defined by design that generally correspond to well defined ratios (e.g., current mirror gain ratios, resistor ratios, etc.) By appropriate definition of design parameters (resistor values and ratios), a skilled designer may zero the terms in Equations 1 and 2 that create sensitivity to BJT current gain $\beta=I_C/I_B$ while still allowing VTSH to be set at values below or above the Silicon Bandgap voltage. This is accomplished by defining design parameters such that:

$$1 - \frac{R_3}{N_1R_2} = 0; \; N_3 - \frac{1}{N_1}\left(\frac{R3}{R2} + 1\right) = 0; \; N_4 - 1 - \frac{R3}{R2} = 0$$

In which case Equations 1 and 2 become:

$$V_{TSH} = V_{BE1}(I_C)\left[1 + R_1\left(\frac{1}{R_4} - \frac{R_3}{R_2R_5}\right)\right] + (V_{BE1} - V_{BE2})\frac{R_1}{R_2}\left(1 + \frac{R_3}{R_5}\right)$$

$$I_C = \frac{(V_{BE1} - V_{BE2})}{N_2R_2}$$

The voltage threshold VTSH can be set at any voltage level and all terms dependent on the base current $I_B$ may be "zeroed" (to eliminate sensitivity to β) through device sizing of resistive elements such as R2, R3, and R5. It should be noted that elements $R_3$, $R_4$, $R_5$, $N_3$ and $N_4$ are optional and can be excluded, like in FIG. 1, which leads to simpler circuits but at the cost of restricting the threshold voltage VTSH range of options and/or having some sensitivity to β.

Figure 4:
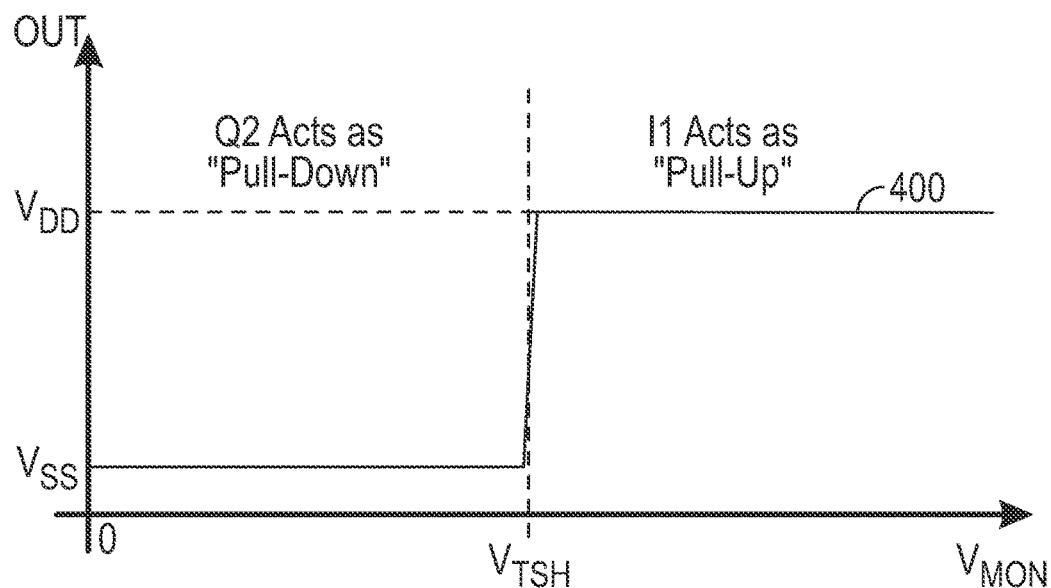
FIG. 4 is a graph of an example of an output signal at the AOUT node of FIGS. 1-3.

FIG. 4 is a graph of an example of an output signal at the AOUT node of FIGS. 1-3. The x-axis represents voltage, and the y-axis represents the output signal OUT at the AOUT node. The digital output signal OUT 400 represents whether the collector current IC2 of transistor Q2, such as in FIGS. 1-3, is higher or lower than that of the current I1 of the second current source 109. The digital output signal OUT 400 includes binary states indicating whether the monitored voltage exceeds a specified threshold value.

As seen in FIG. 4, between 0 and the threshold voltage $V_{TSH}$, the output signal is a low logic level, e.g., the reference node voltage VSS, as the transistor Q2 acts as a pull-down and pulls the AOUT node low. When the voltage is greater than the threshold voltage $V_{TSH}$, the output signal is a high logic level, e.g., the supply node voltage VDD, as the second current source 109 acts as a pull-up and pulls the AOUT node high.

FIGS. 5-15 depicts specific configurations that implement the techniques shown in FIGS. 1-3.

Figure 5:
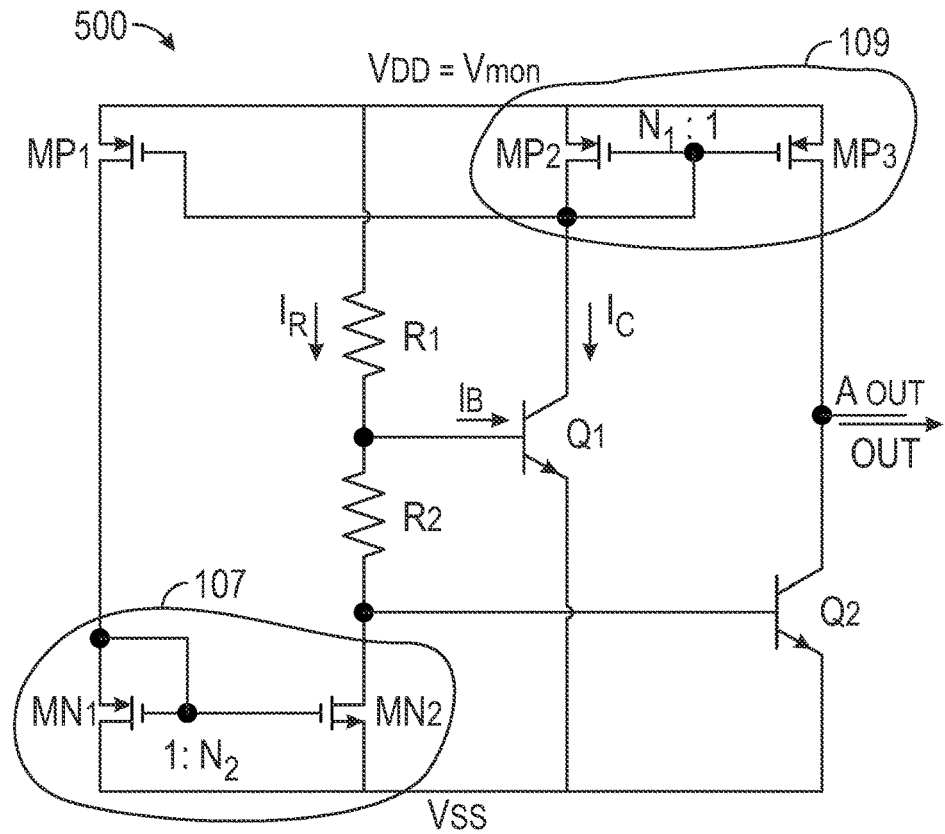
FIG. 5 is another example of a voltage monitoring circuit 500 having a built-in reference and configured to monitor a voltage, in accordance with this disclosure.

FIG. 5 is another example of a voltage monitoring circuit 500 having a built-in reference and configured to monitor a voltage, in accordance with this disclosure. Some of the elements of the voltage monitoring circuit 500 are similar to those of voltage monitoring circuits of at least FIGS. 1-3. As such, similar reference numbers are used and, for conciseness, similar elements will not be described in detail again.

The first current source 107 includes a first current mirror circuit, such as formed using n-type field-effect transistors (FETs) MN1 and MN2. The FET MN2 is a current source that sinks a current proportional to the first collector current $I_C$. The second current source 109 includes a second current mirror circuit, such as formed using p-type FETs MP2 and MP3. The FET MP3 is a current source that sources a current proportional to the first collector current $I_C$ into the AOUT node. The voltage monitoring circuit 500 includes resistors R1 and R2 and does not include optional resistors R3, R4, or R5.

The threshold voltage VTSH can be set to the bandgap voltage, with some sensitivity to β, which can be mitigated by making $I_{R1} \gg I_B$.

The threshold voltage VTSH is given by Equation 3:

$$V_{TSH} = V_{BE1}(I_C) + \frac{R_1}{R_2}(V_{BE1} - V_{BE2}) + R_1 I_B \quad \text{Equation 3}$$

The collector current $I_C$ in Equation 3 is given by Equation 4:

$$I_C = \frac{1}{N_2} \frac{(V_{BE1} - V_{BE2})}{R_2} - \frac{1}{N_1 N_2} I_B \text{ and } I_B = \frac{I_C}{\beta} \quad \text{Equation 4}$$

Figure 6:
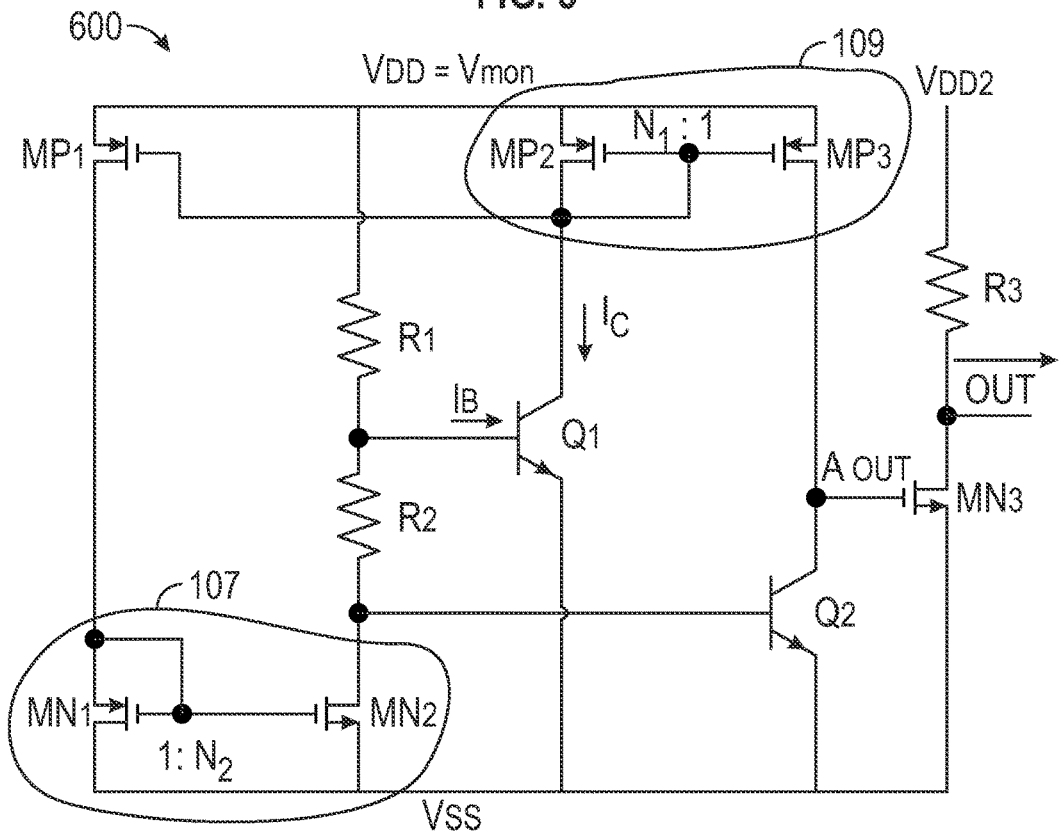
FIG. 6 is another example of a voltage monitoring circuit 600 having a built-in reference and configured to monitor a voltage, in accordance with this disclosure.

FIG. 6 is another example of a voltage monitoring circuit 600 having a built-in reference and configured to monitor a voltage, in accordance with this disclosure. Some of the elements of the voltage monitoring circuit 600 are similar to those of voltage monitoring circuits of at least FIGS. 1-3 and 5. As such, similar reference numbers are used and, for conciseness, similar elements will not be described in detail again.

Like FIG. 5, the first current source 107 of voltage monitoring circuit 600 includes a first current mirror circuit and the second current source 109 includes a second current mirror circuit. In FIG. 6, the voltage monitoring circuit 500 of FIG. 5 is coupled to a cross-domain output stage, such as to convert from one power domain to another (VDD1 and VDD2).

The voltage monitoring circuit 600 includes a first power supply node VDD1, e.g., the monitored voltage, and a second power supply node VDD2 coupled to the FET MN3 via a resistive element R3. The gate of the FET MN3 is coupled to the collector of the BJT Q2, and the current comparison node AOUT is coupled to a drain of the FET MN3. The signal OUT is reliable for any VDD1 value.

The threshold voltage VTSH is given by Equation 5:

$$V_{TSH} = V_{BE1}(I_C) + \frac{R1}{R2}(V_{BE1} - V_{BE2}) + R_1 I_B \quad \text{Equation 5}$$

The collector current $I_C$ in Equation 5 is given by Equation 6:

$$I_C = \frac{1}{N_2} \frac{(V_{BE1} - V_{BE2})}{R_2} - \frac{1}{N_1 N_2} I_B \text{ and } I_B = \frac{I_c}{\beta} \quad \text{Equation 6}$$

Figure 7:
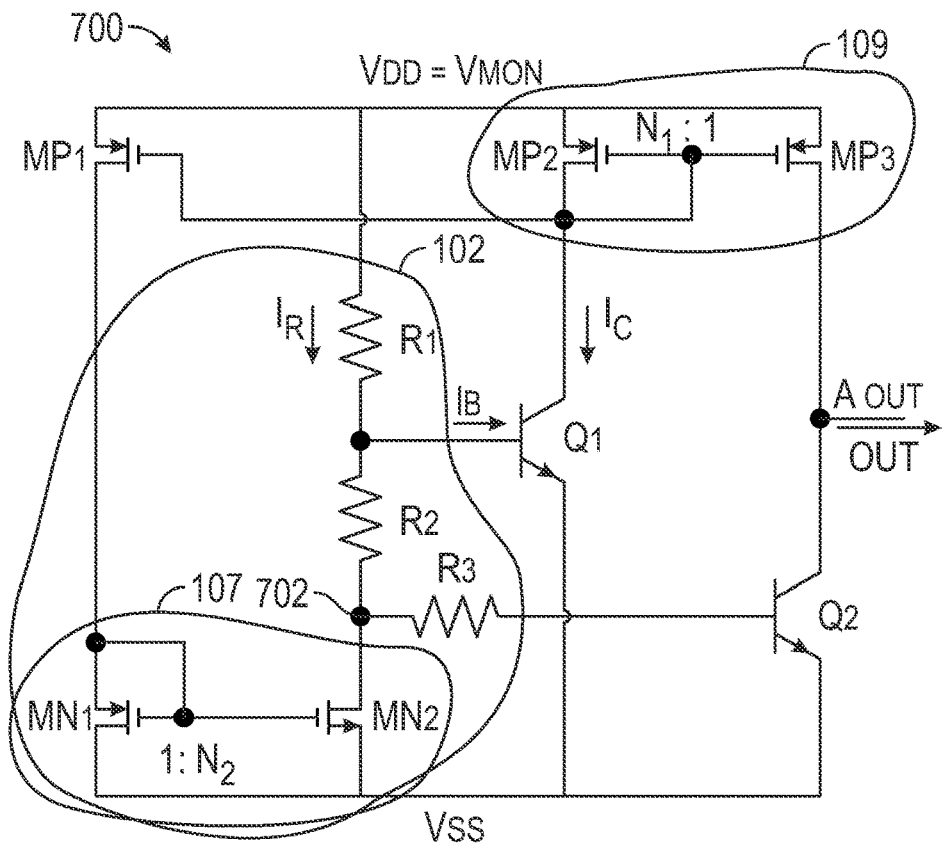
FIG. 7 is another example of a voltage monitoring circuit 700 having a built-in reference and configured to monitor a voltage, in accordance with this disclosure.

FIG. 7 is another example of a voltage monitoring circuit 700 having a built-in reference and configured to monitor a voltage, in accordance with this disclosure. Some of the elements of the voltage monitoring circuit 700 are similar to those of voltage monitoring circuits of at least FIGS. 1-3 and 5. As such, similar reference numbers are used and, for conciseness, similar elements will not be described in detail again.

Like FIG. 5, the first current source 107 of voltage monitoring circuit 700 includes a first current mirror circuit and the second current source 109 includes a second current mirror circuit. The voltage monitoring circuit 700 is similar to the voltage monitoring circuit 500 of FIG. 5, but the biasing network of the closed loop circuit branch 102 further includes a third resistive element R3 coupled between the base of the second BJT Q2 and a terminal 702 of the second resistive element R2.

By sizing R1-R3 appropriately, the voltage monitoring circuit 700 compensates for a term that depends on the current $I_B$ in the threshold voltage VTSH equation. Including $R_3 = R_2 N_1$ cancels out the main β dependent term of the VTSH equation but does not cancel the $I_B$ term in the $I_C$ equation.

The threshold voltage VTSH is given by Equation 7:

$$V_{TSH} = V_{BE1}(I_C) + \frac{R1}{R2}(V_{BE1} - V_{BE2}) \quad \text{Equation 7}$$

The collector current $I_C$ in Equation 7 is given by Equation 8:

$$I_C = \frac{1}{N_2} \frac{(V_{BE1} - V_{BE2})}{R_2} - \frac{1}{N_1 N_2} I_B \text{ and } I_B = \frac{I_c}{\beta} \quad \text{Equation 8}$$

Figure 8:
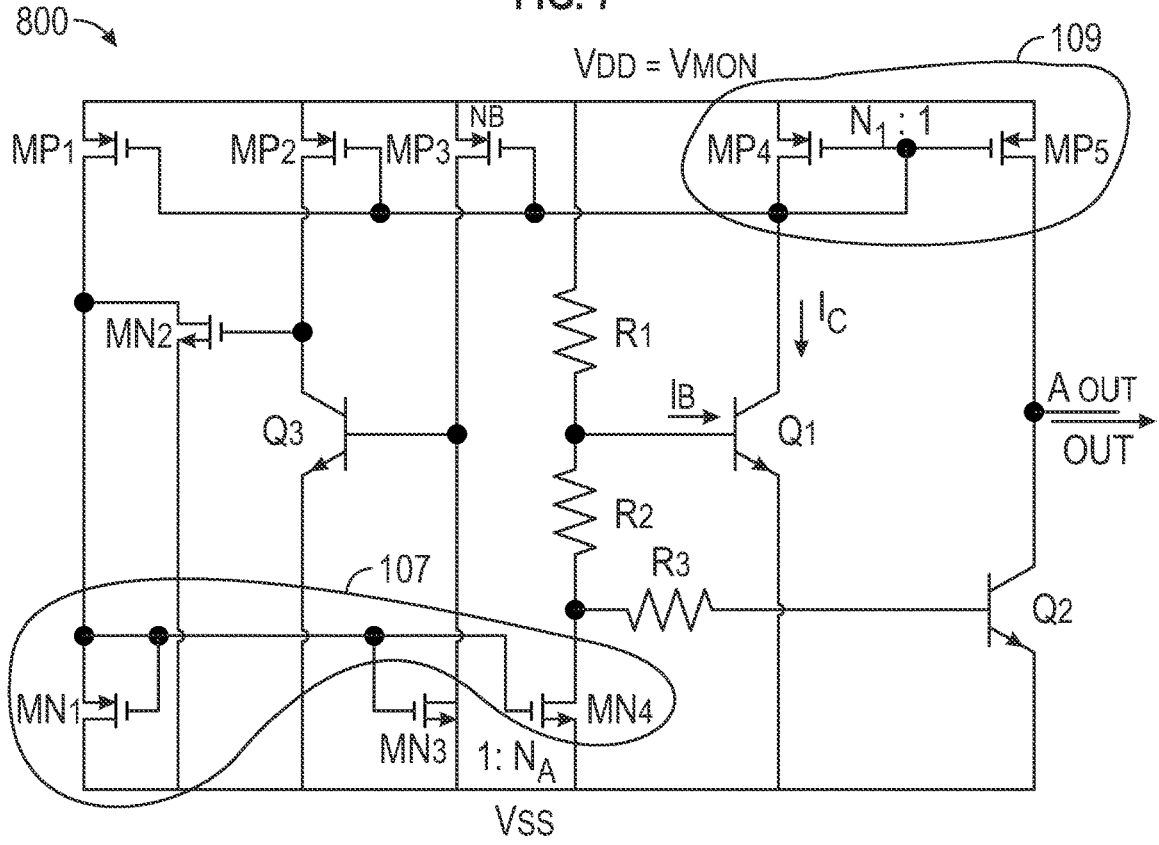
FIG. 8 is another example of a voltage monitoring circuit 800 having a built-in reference and configured to monitor a voltage, in accordance with this disclosure.

FIG. 8 is another example of a voltage monitoring circuit 800 having a built-in reference and configured to monitor a voltage, in accordance with this disclosure. Some of the elements of the voltage monitoring circuit 800 are similar to those of voltage monitoring circuits of at least FIGS. 1-3 and 5. As such, similar reference numbers are used and, for conciseness, similar elements will not be described in detail again.

The voltage monitoring circuit 800 of FIG. 8 is similar to FIG. 7 but includes additional circuitry, such as a loop around the BJT Q3 to cancel out the β dependent term of the $I_C$ equation. The additional circuitry of FIG. 8 generates the I2 current terms depicted in FIG. 2. The BJT Q3 is coupled to the supply voltage VDD via a p-type FET MP2.

Like FIG. 8, the first current source 107 of voltage monitoring circuit 700 includes a first current mirror circuit and the second current source 109 includes a second current mirror circuit. The first current source 107 is implemented using the n-type FET MN4 as a current source. The n-type FET MN4 sinks current carrying the additional current terms.

The n-type FET MN1 sums the additional current components and is mirrored by the n-type FET MN4, which generates a current.

The threshold voltage VTSH is given by Equation 9:

$$V_{TSH} = V_{BE1}(I_C) + \frac{R1}{R2}(V_{BE1} - V_{BE2}) \quad \text{Equation 9}$$

The collector current $I_C$ in Equation 9 is given by Equation 10:

$$I_C = \frac{1}{N_2}\frac{(V_{BE1} - V_{BE2})}{R_2} \text{ and } I_B = \frac{I_C}{\beta} \text{ where } N_2 = \frac{N_A N_B}{N_1} \quad \text{Equation 10}$$

Figure 9:
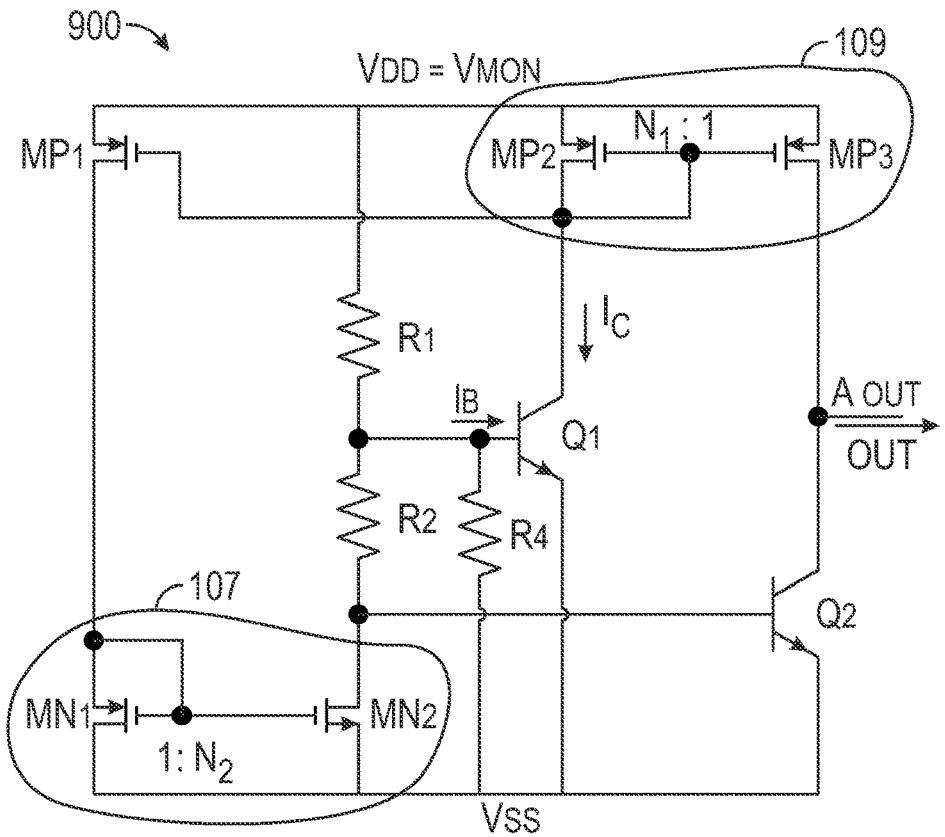
FIG. 9 is another example of a voltage monitoring circuit 900 having a built-in reference and configured to monitor a voltage, in accordance with this disclosure.

FIG. 9 is another example of a voltage monitoring circuit 900 having a built-in reference and configured to monitor a voltage, in accordance with this disclosure. Some of the elements of the voltage monitoring circuit 900 are similar to those of voltage monitoring circuits of at least FIGS. 1-3 and 5. As such, similar reference numbers are used and, for conciseness, similar elements will not be described in detail again.

The first current source 107 of voltage monitoring circuit 700 includes a first current mirror circuit and the second current source 109 includes a second current mirror circuit. The voltage monitoring circuit 900 is similar to the voltage monitoring circuit 500 of FIG. 5, but further includes a resistive element R4 coupled between the base of the BJT Q1 and the reference node VSS. The resistive element R4 is added to scale up the level of the threshold voltage VTSH, such as to set the threshold voltage VTSH above the bandgap voltage.

The threshold voltage VTSH is given by Equation 11:

$$V_{TSH} = \left(1 + \frac{R1}{R4}\right)V_{BE1}(I_C) + \frac{R1}{R2}(V_{BE1} - V_{BE2}) + R_1 I_B \quad \text{Equation 11}$$

The collector current $I_C$ in Equation 11 is given by Equation 12:

$$I_C = \frac{1}{N_2}\frac{(V_{BE1} - V_{BE2})}{R_2} - \frac{1}{N_1 N_2}I_B \text{ and } I_B = \frac{I_C}{\beta} \quad \text{Equation 12}$$

Figure 10:
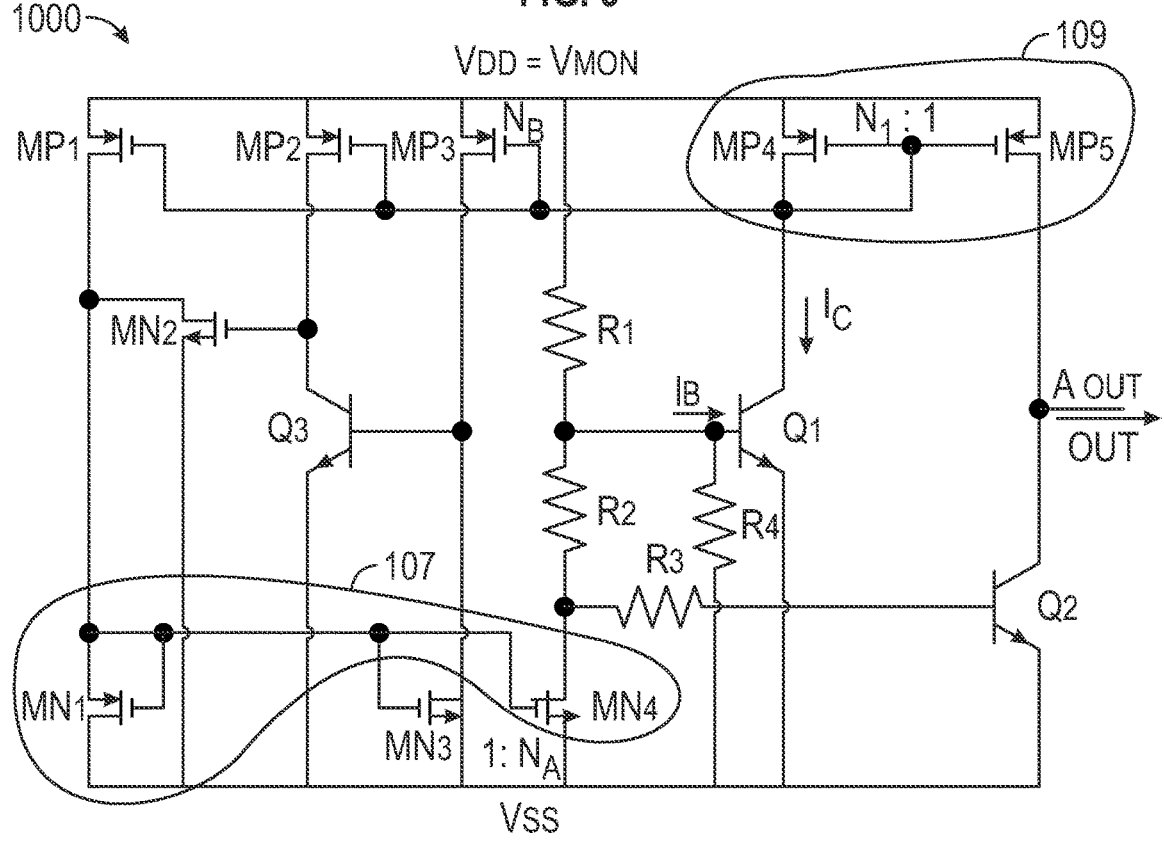
FIG. 10 is another example of a voltage monitoring circuit 1000 having a built-in reference and configured to monitor a voltage, in accordance with this disclosure.

FIG. 10 is another example of a voltage monitoring circuit 1000 having a built-in reference and configured to monitor a voltage, in accordance with this disclosure. Some of the elements of the voltage monitoring circuit 1000 are similar to those of voltage monitoring circuits of at least FIGS. 1-3, 5, and 9. As such, similar reference numbers are used and, for conciseness, similar elements will not be described in detail again.

The voltage monitoring circuit 1000 of FIG. 10 is similar to FIG. 8 but includes additional resistor R4, connected between the base of the BJT Q1 and the reference node VSS, that enables setting $V_{TSH}$ to a level above the Silicon Bandgap voltage.

The threshold voltage VTSH is given by Equation 13:

$$V_{TSH} = \left(1 + \frac{R1}{R4}\right)V_{BE1}(I_C) + \frac{R1}{R2}(V_{BE1} - V_{BE2}) \quad \text{Equation 13}$$

The collector current $I_C$ in Equation 13 is given by Equation 14:

$$I_C = \frac{1}{N_2}\frac{(V_{BE1} - V_{BE2})}{R_2} \text{ and } I_B = \frac{I_C}{\beta} \text{ where } N2 = N_A N_B/N_1 \quad \text{Equation 14}$$

Figure 11:
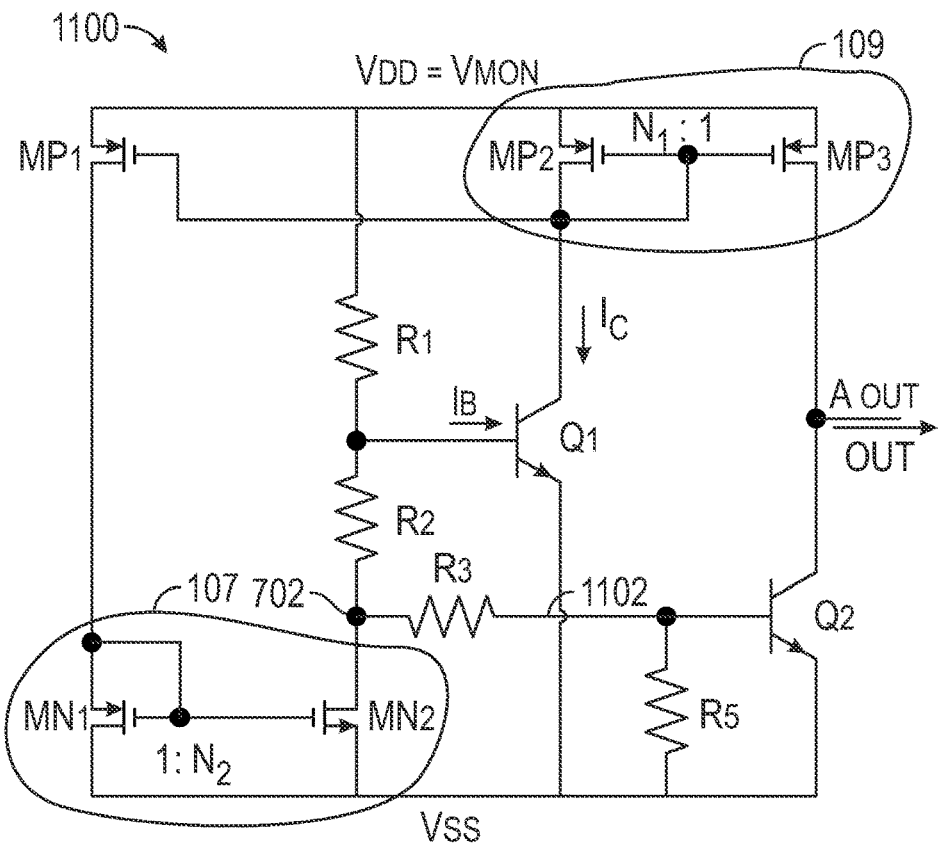
FIG. 11 is another example of a voltage monitoring circuit 1100 having a built-in reference and configured to monitor a voltage, in accordance with this disclosure.

FIG. 11 is another example of a voltage monitoring circuit 1100 having a built-in reference and configured to monitor a voltage, in accordance with this disclosure. Some of the elements of the voltage monitoring circuit 1100 are similar to those of voltage monitoring circuits of at least FIGS. 1-3, 5, and 7. As such, similar reference numbers are used and, for conciseness, similar elements will not be described in detail again.

The first current source 107 of voltage monitoring circuit 700 includes a first current mirror circuit and the second current source 109 includes a second current mirror circuit. The voltage monitoring circuit 1100 is similar to the voltage monitoring circuit 700 of FIG. 7, but further includes a resistive element R5 coupled between a terminal 1102 of the resistive element R3 (which is coupled to the base of the BJT Q2) and the reference node VSS. Including resistive elements R3 and R5 set the threshold voltage VTSH at a level below the bandgap voltage with R3=R2×N1, which cancels out the main β dependent term of the threshold voltage VTSH equation.

The threshold voltage VTSH is given by Equation 15:

$$V_{TSH} = \left(1 - \frac{R_1 R_3}{R_2 R_5}\right)V_{BE1}(I_C) + \frac{R_1}{R_2}\left(1 + \frac{R_3}{R_5}\right)(V_{BE1} - V_{BE2}) \quad \text{Equation 15}$$

The collector current $I_C$ in Equation 15 is given by Equation 16:

$$I_C = \frac{1}{N_2}\frac{(V_{BE1} - V_{BE2})}{R_2} - \frac{(N_1 + 1)}{N_1 N_2}I_B - \frac{(N_1 + 1)}{N_2}\frac{V_{BE2}}{R5} \text{ and } I_B = \frac{I_C}{\beta} \quad \text{Equation 16}$$

Figure 12:
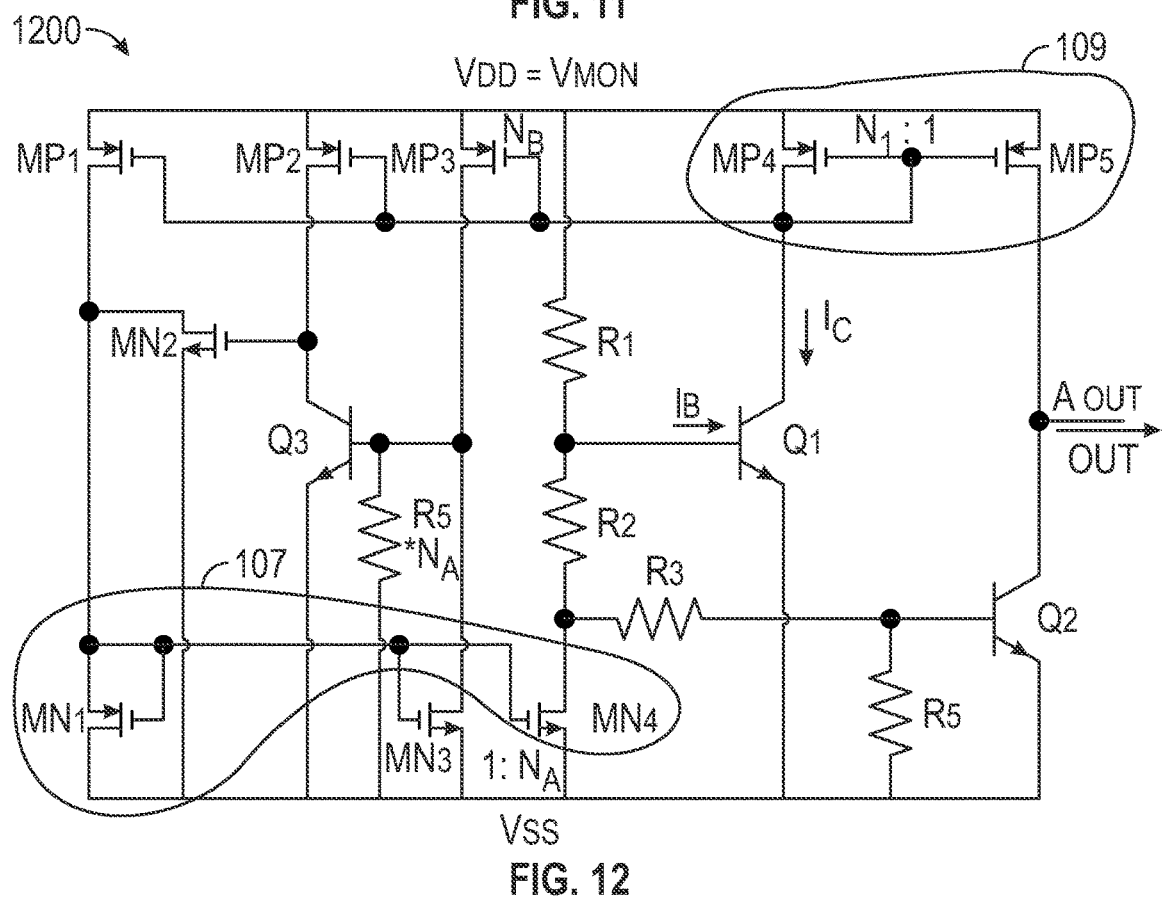
FIG. 12 is another example of a voltage monitoring circuit 1200 having a built-in reference and configured to monitor a voltage, in accordance with this disclosure.

FIG. 12 is another example of a voltage monitoring circuit 1200 having a built-in reference and configured to monitor a voltage, in accordance with this disclosure. Some of the elements of the voltage monitoring circuit 1200 are similar to those of voltage monitoring circuits of at least FIGS. 1-3, 10, and 11. As such, similar reference numbers are used and, for conciseness, similar elements will not be described in detail again.

The voltage monitoring circuit 1200 of FIG. 12 is similar to FIG. 8 but includes additional resistor R5, connected between the base of the BJT Q2 and the reference node VSS, that enables setting VTSH to a level below the Silicon Bandgap voltage.

The threshold voltage VTSH is given by Equation 17:

$$V_{TSH} = \left(1 - \frac{R_1 R_3}{R_2 R_5}\right)V_{BE1}(I_C) + \frac{R_1}{R_2}\left(1 + \frac{R_3}{R_5}\right)(V_{BE1} - V_{BE2}) \quad \text{Equation 17}$$

The collector current $I_C$ in Equation 17 is given by Equation 18:

$$I_C = \frac{1}{N_2}\frac{(V_{BE1} - V_{BE2})}{R_2} \text{ and } I_B = \frac{I_C}{\beta} \text{ where } N2 = N_A N_B/N_1 \quad \text{Equation 18}$$

Figure 13:
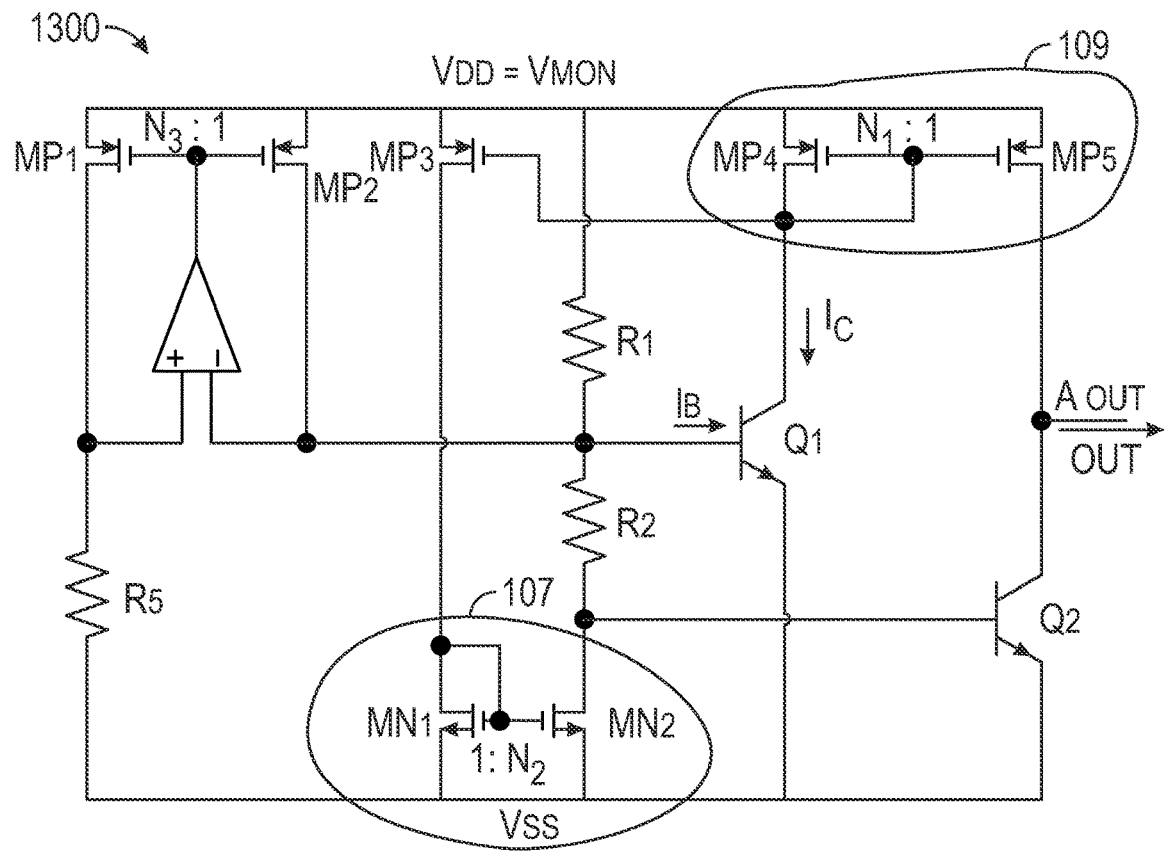
FIG. 13 is another example of a voltage monitoring circuit 1300 having a built-in reference and configured to monitor a voltage, in accordance with this disclosure.

FIG. 13 is another example of a voltage monitoring circuit 1300 having a built-in reference and configured to monitor a voltage, in accordance with this disclosure. Some of the elements of the voltage monitoring circuit 1300 are similar to those of voltage monitoring circuits of at least FIGS. 1-3, and 5. As such, similar reference numbers are used and, for conciseness, similar elements will not be described in detail again.

The first current source 107 of voltage monitoring circuit 700 includes a first current mirror circuit and the second current source 109 includes a second current mirror circuit. The voltage monitoring circuit 1300 provides a different way of generating the threshold voltage VTSH below the bandgap voltage (below 1.2V). The third current source 302 of FIG. 3 is implemented using an operational amplifier 1302. The operational amplifier 1302 has an output coupled to a control terminal, e.g., gate terminal, of the FET MP1 and to a control terminal, e.g., gate terminal, of the FET MP2. A first input, e.g., non-inverting terminal, of the operational amplifier 1302 is coupled to a first terminal, e.g., drain terminal, of the FET MP1, and a second input, e.g., inverting terminal, of the operational amplifier 1302 is coupled to a first terminal, e.g., drain terminal, of the FET MP2. The FET MP2 is configured to operate as third current source 302.

The voltage monitoring circuit 1300 includes a loop around resistive element R5 to set the threshold voltage VTSH at a level below the bandgap voltage. The voltage monitoring circuit 1300 includes a loop around resistive element R5 that copies the VBE voltage of Q1 to the resistive element R5 generating a current in the form of VBE/R5. This current is sourced by MOS transistor MP2 in the form of VBE/(N3R5) to the node between resistors R1 and R2 and enables to set the threshold voltage VTSH at a level below the bandgap voltage.

The threshold voltage VTSH is given by Equation 19:

$$V_{TSH} = \left(1 - \frac{R_1}{R_5 N_3}\right) V_{BE1}(I_C) + \frac{R_1}{R_2}(V_{BE1} - V_{BE2}) + R_1 I_B \quad \text{Equation 19}$$

The collector current $I_C$ in Equation 19 is given by Equation 20:

$$I_C = \frac{1}{N_2} \frac{(V_{BE1} - V_{BE2})}{R_2} - \frac{1}{N_1 N_2} I_B \text{ and } I_B = \frac{I_C}{\beta} \quad \text{Equation 20}$$

Figure 14:
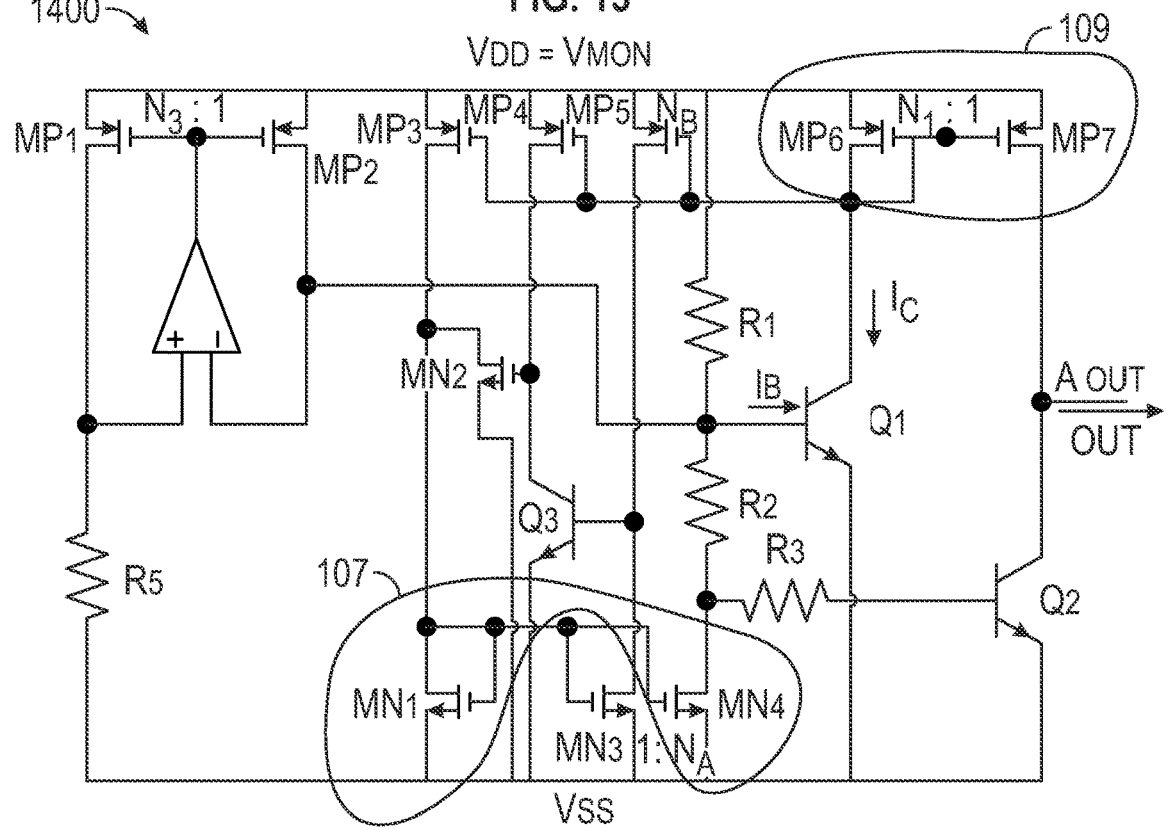
FIG. 14 is another example of a voltage monitoring circuit 1400 having a built-in reference and configured to monitor a voltage, in accordance with this disclosure.

FIG. 14 is another example of a voltage monitoring circuit 1300 having a built-in reference and configured to monitor a voltage, in accordance with this disclosure. Some of the elements of the voltage monitoring circuit 1300 are similar to those of voltage monitoring circuits of at least FIGS. 1-3, and 13. As such, similar reference numbers are used and, for conciseness, similar elements will not be described in detail again.

The voltage monitoring circuit 1400 of FIG. 14 is similar to FIG. 13 but includes additional circuitry, such as a resistive element R3=R2×N1 and a loop around the BJT Q3 to cancel out the β dependent term from the threshold voltage VTSH and $I_C$ equations. The BJT Q3 is coupled to the supply voltage VDD via a FET MP4. The FET MN4 is a current source and is used to cancel terms.

The threshold voltage VTSH is given by Equation 21:

$$V_{TSH} = \left(1 - \frac{R_1}{R_5 N_3}\right) V_{BE1}(I_C) + \frac{R_1}{R_2}(V_{BE1} - V_{BE2}) \quad \text{Equation 21}$$

The collector current $I_C$ in Equation 21 is given by Equation 22:

$$I_C = \frac{1}{N_2} \frac{(V_{BE1} - V_{BE2})}{R_2} \text{ and } I_B = \frac{I_C}{\beta} \text{ where } N_2 = \frac{N_A N_B}{N_1} \quad \text{Equation 22}$$

It should be noted that a skilled designer may make some elements of the implementation adjustable (e.g., resistor values and current ratios) to enable trimming and programmability of threshold voltage VTSH.

Figure 15:
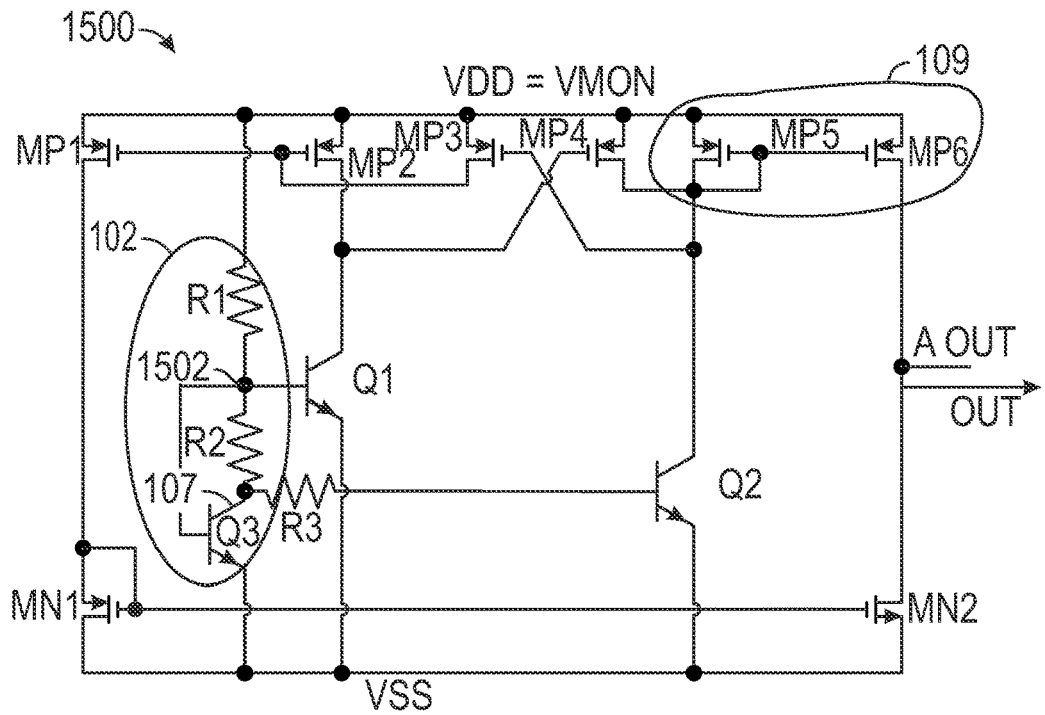
FIG. 15 is another example of a voltage monitoring circuit 1500 having a built-in reference and configured to monitor a voltage, in accordance with this disclosure.

FIG. 15 is another example of a voltage monitoring circuit 1500 having a built-in reference and configured to monitor a voltage, in accordance with this disclosure. Some of the elements of the voltage monitoring circuit 1500 are similar to those of voltage monitoring circuits of at least FIGS. 1-3. As such, similar reference numbers are used and, for conciseness, similar elements will not be described in detail again.

The first current source 107 of FIG. 1 is implemented using the BTJ Q3 of FIG. 15. The BJT Q3 is configured to sink a current that is proportional to the collector current of the BJT Q1, like in FIG. 1. The base of Q3 is coupled to a node 1502, which is a node coupled between the resistive elements R1 and R2 of the biasing network. The node 1502 is also coupled to the base of the BJT Q1 and, as such, the base of the BJT Q1 and the BJT Q3 are at the same voltage. In addition, the emitter of the BJT Q1 and the BJT Q3 are at the same voltage. Thus, the BJT Q3 is a current mirror with respect to Q1 and copies the current of BJT Q1 to implement the current $I2=N_2 I_C$, where $N_2$ is the ratio of areas between the two BJTs, with BJT Q3 being $N_2$ times larger in area than BJT Q1.

The p-type FET MP2 copies the collector current of the BJT Q1 to the p-type FET MP1. The p-type FET MP1 sends that current to another current mirror formed by n-type FET MN1 and n-type FET MN2.

The voltage monitoring circuit 1500 includes a second current source 109 formed by a current mirror that includes p-type FET MP5 and p-type FET MP6. The collector current of the BJT Q2 is mirrored by the current mirror formed by p-type FET MP5 and p-type FET MP6. As such, the collector of the BJT Q2 is coupled to the current comparison node AOUT.

Unlike in FIG. 1, for example, the current comparison node AOUT is positioned in another circuit branch formed by the p-type FET MP6 and the n-type FET MN2 and different than that of the BJT Q2. The current comparison node AOUT compares a representation of the collector current of the BJT Q2 (via p-type FET MP6) and a representation of a current proportional to the collector current through BJT Q1 (via MN2).

The cross-couple pair formed by MP3 and MP4 may be included to increase the sensitivity of output OUT to the monitored voltage VMON, i.e., the comparison gain. A p-type FET MP3 can be matched to the diode-connected p-type FET MP2 and a p-type FET MP4 can be matched to the diode-connected p-type FET MP5. A gate of the p-type FET MP3 is coupled to the collector of the BJT Q2 and a gate of the p-type FET MP4 is coupled to the collector of the BJT Q1, providing a cross-coupled structure, which can increase the gain at corresponding nodes.

Figure 16:
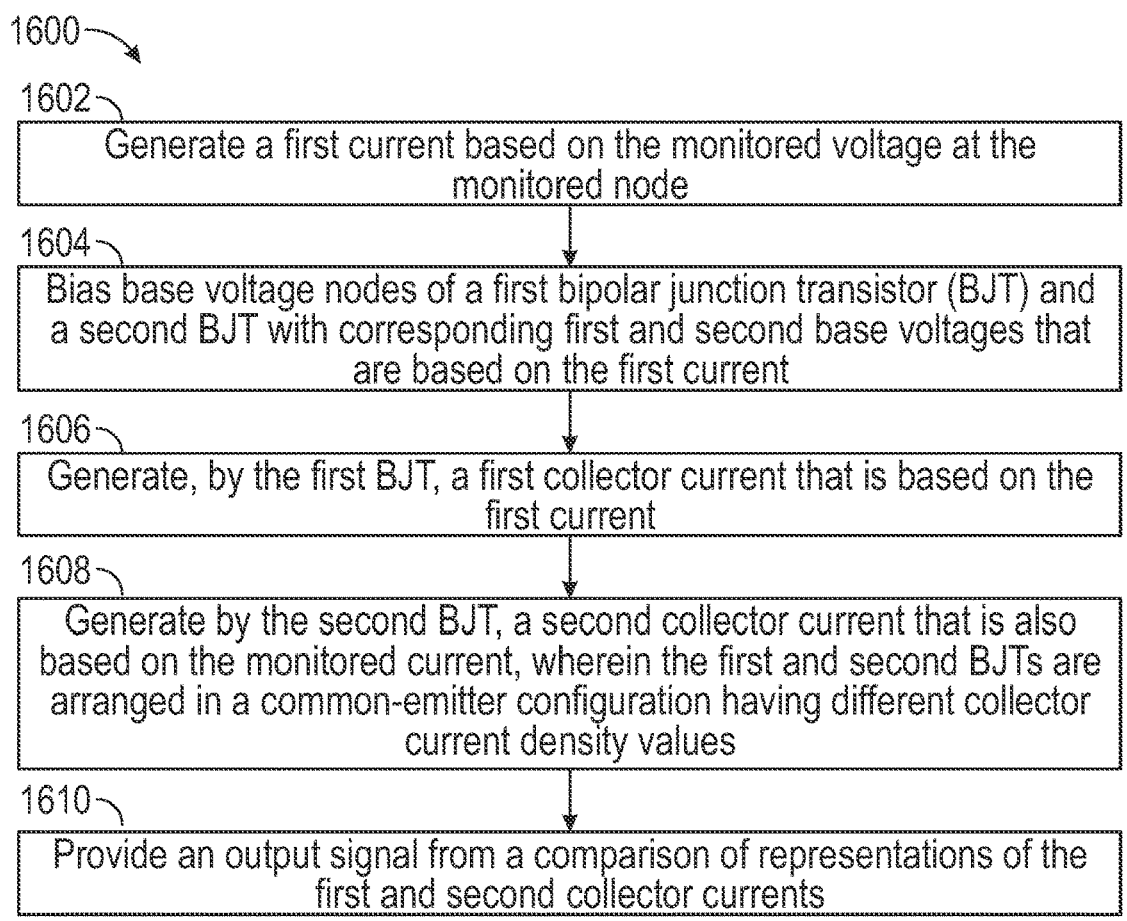
FIG. 16 is an example of a flow diagram of a voltage monitoring method 1600 for using a built-in reference for monitoring a voltage at a monitored node, in accordance with various techniques of this disclosure.

FIG. 16 is an example of a flow diagram of a voltage monitoring method 1600 for using a built-in reference for monitoring a voltage at a monitored node, in accordance with various techniques of this disclosure. At block 1602, the method 1600 includes generating a first current based on the monitored voltage at the monitored node. For example, the first current source 107 of FIG. 1 can sink a first current I2 that is proportional to the first collector current $I_C$.

At block 1604, the method 1600 includes biasing base voltage nodes of a first bipolar junction transistor (BJT) and a second BJT with corresponding first and second base voltages that are based on the first current. For example, the biasing network of FIG. 1 includes a first resistive element R1 and a second resistive element R2 coupled in series and further includes the first current source 107. The biasing network is coupled to a first base 108 of the first BJT Q1 and configured to generate a first voltage V1 dependent at least on the monitored voltage VMON to bias a second BJT Q2. In some examples, biasing the base voltage node of the second BJT Q2 includes generating a first voltage dependent at least on the monitored voltage.

At block 1606, the method 1600 includes generating, by the first BJT, a first collector current that is based on the first current.

At block 1608, the method 1600 includes generating, by the second BJT, a second collector current that is also based on the monitored current, wherein the first and second BJTs are arranged in a common-emitter configuration having different collector current density values. In FIGS. 1-3 and 5-15, the first BJT Q1 and the second BJT Q2 are arranged in a common-emitter configuration having different collector current density values.

At block 1610, the method 1600 includes providing an output signal from a comparison of representations of the first and second collector currents. For example, in FIG. 1 the current comparison node AOUT is configured to generate an output signal OUT representing a comparison between a representation of the second current I1 and a representation of the second collector current IC2. The output signal OUT is a digital signal, such as from 0 to VDD, that can be received a digital circuit. In some examples, the output signal OUT can be supplied to an output pin of an IC.

In some examples, the method 1600 includes generating, via a third BJT, a first current that is proportional to the first collector current. In some examples, the method 1600 includes generating, via a current source, a second current that is proportional to the second collector current. In some optional examples, providing the output signal from the comparison of representations of the first and second collector currents includes generating the output signal from the comparison between a representation of the second current and a representation of the second collector current.

In some optional examples, the method 1600 includes sinking, via a first current source, a first current that is proportional to the first collector current.

In some optional examples, the method 1600 includes setting the monitored voltage above or below a bandgap voltage.

In some optional examples, the method 1600 includes reducing a sensitivity to a BJT current gain, such by coupling a first resistive element between the base voltage node of the first BJT and a reference node, coupling a second resistive element between the base voltage node of the second BJT and the reference node, and coupling a third resistive element between a first current source and the base voltage node of the second BJT.

In some optional examples, the method 1600 includes sourcing a third current proportional to the second collector current of the second BJT.

In some optional examples, the method 1600 includes providing a first current source configured to sink a current proportional to the first collector current, such as by including providing a first current mirror circuit. In some examples, providing a first current source configured to sink a current proportional to the first collector current includes providing a third BJT, where a base voltage node of the third BJT is coupled the base voltage node of the first BJT.

In some optional examples, the method 1600 includes comparing a representation of the first collector current and a representation of the second current at a current comparison node. In some examples, the current comparison node is positioned in a circuit branch different than that of the second BJT.

In some optional examples, the method 1600 includes copying, via a current mirror circuit, the first collector current to the circuit branch.

VARIOUS NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A voltage monitoring circuit having a built-in reference and configured to monitor a voltage, the voltage monitoring circuit comprising:
   a closed loop circuit branch including:
   a first bipolar junction transistor (BJT) having:
   a first collector configured to produce a first collector current, wherein the first collector current is a function of the monitored voltage; and
   a first emitter coupled to a reference node;
   a biasing network coupled to a first base of the first BJT and configured to generate a first voltage dependent at least on the monitored voltage to bias a second BJT, the biasing network including a first current source configured to sink a first current that is proportional to the first collector current; and
   a second current source coupled to a power supply node and configured to source a second current that is proportional to the first collector current to a current comparison node;
   the second BJT having:
   a second base coupled to the first voltage;
   a second emitter coupled to the reference node;
   a second collector coupled to the current comparison node and configured to receive a second collector current, wherein the current comparison node is configured to generate a signal representing a comparison between a representation of the second current and a representation of the second collector current.

2. The voltage monitoring circuit of claim 1, wherein the first current source includes a first current mirror circuit, and wherein the second current source includes a second current mirror circuit.

3. The voltage monitoring circuit of claim 1, wherein the power supply node is a first power supply node, the voltage monitoring circuit further comprising:
   a second power supply node coupled to a first field-effect transistor (FET) via a resistive element, wherein a gate of the first FET is coupled to the second collector of the second BJT, and wherein the current comparison node is coupled to a drain of the first FET.

4. The voltage monitoring circuit of claim 1, wherein the biasing network includes a first resistive element and a second resistive element coupled in series, the voltage monitoring circuit comprising at least one of:
   a third resistive element coupled between the second base of the second BJT and a terminal of the second resistive element;
   a fourth resistive element coupled to the first base of the first BJT and the reference node; and
   a fifth resistive element coupled to the second base of the second BJT and the reference node.

5. The voltage monitoring circuit of claim 4, comprising:
   a third current source coupled to the power supply node and to the first base of the first BJT and configured to source a third current proportional to the base-emitter voltage of the first of the second BJT.

6. The voltage monitoring circuit of claim 5, wherein the third current source includes a fourth field-effect transistor (FET) transistor having a control terminal, the voltage monitoring circuit comprising:
   an operational amplifier having an output coupled to the control terminal of the fourth FET and to a control terminal of a fifth FET, wherein a first input of the operational amplifier is coupled to a first terminal of the fourth FET and a second input of the operational amplifier is coupled to a first terminal of the fifth FET.

7. The voltage monitoring circuit of claim 5, wherein the third current source includes a fourth field-effect transistor (FET) transistor having a control terminal, the voltage monitoring circuit comprising:
   an operational amplifier having an output coupled to the control terminal of the fourth FET and to a control terminal of a fifth FET, wherein a first input of the operational amplifier is coupled to a first terminal of the fourth FET and a second input of the operational amplifier is coupled to a first terminal of the fifth FET; and
   a third BJT coupled to the supply voltage via a fifth FET.

8. The voltage monitoring circuit of claim 1, wherein the biasing network includes a first resistive element and a second resistive element coupled in series, the voltage monitoring circuit further comprising:
   a third resistive element coupled between the second base of the second BJT and a terminal of the second resistive element.

9. The voltage monitoring circuit of claim 8, wherein the first current source includes a first field-effect transistor (FET) current mirror, and wherein the second current source includes a second FET current mirror.

10. The voltage monitoring circuit of claim 8, wherein the first current source includes a first field-effect transistor (FET) current mirror, and wherein the second current source includes a second FET current mirror, the voltage monitoring circuit further comprising:
    a third BJT coupled to the supply voltage via a second FET.

11. The voltage monitoring circuit of claim 1, wherein the biasing network includes a first resistive element and a second resistive element coupled in series, the voltage monitoring circuit further comprising:
    a fourth resistive element coupled between the first base of the first BJT and the reference node.
12. The voltage monitoring circuit of claim 11, wherein the first current source includes a first field-effect transistor (FET) current mirror, and wherein the second current source includes a second FET current mirror, the voltage monitoring circuit further comprising:
    a third BJT coupled to the supply voltage via a third FET.
13. The voltage monitoring circuit of claim 1, wherein the biasing network includes a first resistive element and a second resistive element coupled in series, the voltage monitoring circuit further comprising:
    a third resistive element coupled between the second base of the second BJT and a terminal of the second resistive element; and
    a fifth resistive element coupled between a terminal of the third resistive element and the reference node.
14. The voltage monitoring circuit of claim 13, comprising:
    a fourth resistive element coupled between the first base of the first BJT and the reference node;
    wherein at least one of the first resistive element, the fourth resistive element, and the fifth resistive element has an adjustable resistance.
15. The voltage monitoring circuit of claim 13, wherein the first current source includes a first field-effect transistor (FET) current mirror, and wherein the second current source includes a second FET current mirror, the voltage monitoring circuit further comprising:
    a third BJT coupled to the monitored voltage via a third FET.
16. The voltage monitoring circuit of claim 15, comprising:
    a fourth resistive element coupled between the first base of the first BJT and the reference node,
    wherein at least one of the first resistive element, the fourth resistive element, and the fifth resistive element has an adjustable resistance.
17. A voltage monitoring circuit having a built-in reference and configured to monitor a voltage, the voltage monitoring circuit comprising:
    a closed loop circuit branch including:
    a first bipolar junction transistor (BJT) having:
    a first collector configured to produce a first collector current, wherein the first collector current is a function of the monitored voltage; and
    a first emitter coupled to a reference node;
    a biasing network coupled to a first base of the first BJT and configured to generate a first voltage dependent at least on the monitored voltage to bias a second BJT, the biasing network including a third BJT configured to sink a first current that is proportional to the first collector current; and
    a second current source coupled to a power supply node and configured to source a second current that is proportional the first collector current to a current comparison node;
    the second BJT having:
    a second base coupled to the first voltage;
    a second emitter coupled to the reference node;
    a second collector coupled to the current comparison node and configured to receive a second collector current,
    wherein the current comparison node is configured to generate a signal representing a comparison between a representation of the second current and a representation of the second collector current.
18. The voltage monitoring circuit of claim 17, wherein the second current source includes a current mirror circuit.
19. A voltage monitoring circuit having a built-in reference and configured to monitor a voltage at a monitored node, the voltage monitoring circuit comprising:
    means for generating a first current based on the monitored voltage at the monitored node;
    means for biasing base voltage nodes of a first bipolar junction transistor (BJT) and a second BJT with corresponding first and second base voltages that are based on the first current;
    means for generating, by the first BJT, a first collector current that is based on the first current;
    means for generating, by the second BJT, a second collector current that is also based on the first current, wherein the first and second BJTs are arranged in a common-emitter configuration having different collector current density values;
    means for providing an output signal, wherein the output signal includes binary states indicating whether the monitored voltage exceeds a specified threshold value; and
    a third BJT configured to act as a current mirror and copy the first collector current of the first BJT, wherein a base of the third BJT is coupled with the base voltage node of the first BJT.
20. The voltage monitoring circuit of claim 19, wherein the output signal represents a comparison of the first and second collector currents.

* * * * *